(12) United States Patent
Tamiya

(10) Patent No.: US 11,281,431 B2
(45) Date of Patent: Mar. 22, 2022

(54) RANDOM NUMBER GENERATING CIRCUIT AND SEMICONDUCTOR APPARATUS

(71) Applicant: FUJITSU LIMITED, Kawasaki (JP)

(72) Inventor: Yutaka Tamiya, Yokohama (JP)

(73) Assignee: Fujitsu Limited, Kawasaki (JP)

(*) Notice: Subject to any disclaimer, the term of this patent is extended or adjusted under 35 U.S.C. 154(b) by 6 days.

(21) Appl. No.: 16/734,457

(22) Filed: Jan. 6, 2020

(65) Prior Publication Data
US 2020/0241841 A1 Jul. 30, 2020

(30) Foreign Application Priority Data
Jan. 24, 2019 (JP) .............................. JP2019-010295

(51) Int. Cl.
*G06F 7/58* (2006.01)
(52) U.S. Cl.
CPC ........ *G06F 7/584* (2013.01); *G06F 2207/581* (2013.01)
(58) Field of Classification Search
CPC .................................................. G06F 7/58–588
USPC .................................................. 708/250–256
See application file for complete search history.

(56) References Cited

U.S. PATENT DOCUMENTS

| 3,742,381 A * | 6/1973 | Hurd ...................... H03B 29/00 331/78 |
| 2004/0078401 A1* | 4/2004 | Hilton ..................... G06F 7/584 708/252 |

FOREIGN PATENT DOCUMENTS

| JP | 4-46413 | 2/1992 | |
| JP | 11-24894 | 1/1999 | |
| WO | WO-9110182 A1 * | 7/1991 | ............. G06F 7/584 |
| WO | WO-2013013480 A1 * | 1/2013 | ............. G06F 7/584 |

OTHER PUBLICATIONS

S. Watanabe, et al., "A VLSI Design of Mersenne Twister", Information Processing Society of Japan Technical Report Computer Security (CSEC), 2005 (41 (2005-CSEC-209)), 13-18 (May 19, 2005), with Partial English Translation and Abstract.

* cited by examiner

*Primary Examiner* — Matthew D Sandifer

(57) ABSTRACT

A random number generating circuit includes M random number generators, where M is an integer greater than or equal to 2, configured to be independent of each other and generate M random number sequences, a delay adjustment circuit configured to output N sets of the M random number sequences including N different relative time differences or N different combinations of a plurality of relative time differences, where N is an integer greater than or equal to 2, by adjusting one or more relative time differences between the M random number sequences, and a logic operation circuit configured to perform an exclusive OR operation between the M random number sequences included in a set, for each of the N sets of the M random number sequences.

6 Claims, 7 Drawing Sheets

RANDOM NUMBER GENERATING CIRCUIT AND SEMICONDUCTOR APPARATUS

CROSS-REFERENCE TO RELATED APPLICATIONS

The present application is based upon and claims the benefit of priority from the prior Japanese Patent Application No. 2019-010295 filed on Jan. 24, 2019, with the Japanese Patent Office, the entire contents of which are incorporated herein by reference.

FIELD

The disclosures herein relate to a random number generating circuit, a semiconductor apparatus, and a non-transitory computer-readable storage medium for storing program.

BACKGROUND

A random number generator is used in various fields. It is difficult to generate a genuine random number by a circuit, and a pseudo random number that a pseudo random number generating circuit, such as a linear feedback shift register and Mersenne Twister, generates by performing a deterministic calculation, is normally used. A random number requires being random. Thus, being uncorrelated in space and time between generated random numbers is required. It is difficult for a pseudo random number to achieve randomness in a strict sense, but randomness regarded in a practical sense is achieved by implementing a very long cycle, for example.

In a field of financial engineering, for example, a stochastic simulation called a Monte Carlo simulation is often used for a simulation targeted to a model with complicated properties. A Monte Carlo simulation is based on a trial that stochastically determines a transition of a state of a target model by a random number, and simulates the target model by performing multiple trials.

In a field of computer engineering, for example, a calculation algorithm that uses stochastic computing has received attention recently with respect to a power saving, a space saving, and an error tolerance. One implementation of stochastic computing represents a variable in a random bit sequence formed by "1"s and "0"s called a stochastic number (i.e., SN). A value stored in a variable is expressed by the occurrence probability of 1 (in a range of 0 to 1) in a bit sequence. An order and a position of "0" and "1" in a bit sequence do not have a meaning, and the longer a bit sequence is, the higher the accuracy is. A random number generator is used in order to convert a binary number used by a general computer to an SN variable. Multiplication of two stochastic numbers can be achieved by a 2-input AND gate, and addition of two stochastic numbers can be achieved by a 2-input multiplexer that has a 0.5 probability of 2-input selection. In this case, each adder requires one random number generator.

Whether in a Monte Carlo simulation or stochastic computing, a random number generator is required for a hardware implementation. When a Monte Carlo simulation is parallelized by utilizing hardware properties, there is a problem that parallelization becomes meaningless as all trials are same if a parallelized simulation uses the same random number sequence. When variables that are not correlated with each other are calculated in stochastic computing, there is a problem that calculation accuracy is decreased unless random numbers involved with the variables are independent of each other (i.e., random numbers are not correlated with each other).

Some random number generating circuits generating multiple random numbers are proposed. (See Patent Document 1, 2, and Non-Patent Document 1). However, there is a problem that cross-correlation is produced among multiple generated random number sequences, or an overhead of a circuit required for each random number sequence is large.

RELATED-ART DOCUMENTS

Patent Document

[Patent Document 1] Japanese Laid-Open Patent Publication No. 11-24894
[Patent Document 2] Japanese Laid-Open Patent Publication No. 04-46413

Non-Patent Document

[Non-Patent Document 1]
S. Watanabe, K. Abe, "A VLSI Design of Mersenne Twister", Information Processing Society of Japan Technical Report Computer Security (CSEC), 2005 (41 (2005-CSEC-209)), 13-18 (2005 May 19)

SUMMARY

According to an aspect of the embodiment, a random number generating circuit includes M random number generators, where M is an integer greater than or equal to 2, configured to be independent of each other and generate M random number sequences, a delay adjustment circuit configured to output N sets of the M random number sequences including N different relative time differences or N different combinations of a plurality of relative time differences, where N is an integer greater than or equal to 2, by adjusting one or more relative time differences between the M random number sequences, and, a logic operation circuit configured to perform an exclusive OR operation between the M random number sequences included in a set, for each of the N sets of the M random number sequences.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments of the present invention will be described in detail with reference to the accompanying drawings. In the following drawings, the same or corresponding constituent elements are denoted by the same or corresponding reference numbers, and descriptions thereof are omitted as appropriate.

Figure 1:
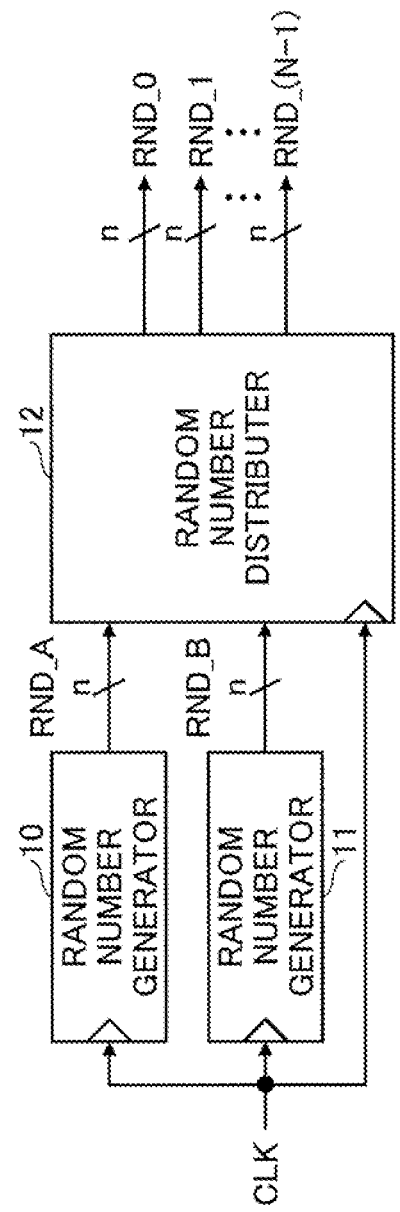
FIG. 1 is a block diagram illustrating an example of a configuration of a random number generating circuit.

FIG. 1 is a block diagram illustrating an example of a configuration of a random number generating circuit. In FIG. 1 and the subsequent drawings, boundaries between functional block illustrated as boxes basically indicate functional boundaries, and may not correspond to separation in terms of physical positions, separation in terms of electrical signals, separation in terms of control logic, etc. A random number generating circuit may have a hardware configuration implemented by combining electronic circuit blocks having the functions of respective functional blocks, or may have a software configuration in which the functions of respective functional blocks are implemented by software executed by a general-purpose processor that is an electronic circuit. In the case of hardware implementation, each functional block may be a hardware module that is physically separated from other blocks to some extent, or may indicate a function in a hardware module in which the block and other blocks are physically combined together. In the case of software implementation, each functional block may be a software module that is logically separated from other blocks to some extent, or may indicate a function in a software module in which the block and other blocks are logically combined together.

The random number generating circuit illustrated in FIG. 1 includes a random number generator 10, a random number generator 11, and a random number distributer 12. The random number generator 10, the random number generator 11, and the random number distributer 12 are synchronized with a clock signal CLK. The random number generators 10 and 11 generate random number sequences (i.e., random numbers in time series) in which each random number has n bits (n is an integer greater than or equal to 1). A random number sequence RND_A and a random number sequence RND_B that two random number generators 10 and 11 generate respectively are input to the random number distributer 12. The random number distributer 12 generates N or more random number sequences (N is an integer greater than or equal to 3) from RND_0 to RND_(N−1) in which each random number has n bits, based on the random number sequence RND_A and the random number sequence RND_B.

In FIG. 1, two random number generators are provided, but the number of random number generators is not limited to 2. Generally, M random number generators (M is greater than or equal to 2) that are independent of each other and that generate M random number sequences, may be provided.

Each of the random number generators 10 and 11 may be a physical random number generator that generates a random number by using an inherently random physical phenomenon such as thermal noise in a device, and may be a pseudo random number generator that generates a pseudo random number that is not sufficiently regular for practical use. In the following description, when expressions such as "independent", "not correlated", "uncorrelated", "not regular", "random", and "aperiodic" are used for properties of a random number, the expressions indicate a state that satisfies the properties of a random number in a practical sense.

In order to say the properties are satisfied in a practical sense, a best state that a pseudo random number generating circuit, which is supposed to be used, can provide is preferably achieved. For example, when a pseudo random number generating circuit uses Mersenne Twister, in a practical sense, a generated random number is considered to be aperiodic and uncorrelated in time, as a cycle of a random number can be a very long cycle such as $2^{19337}-1$. However, when the random number generators 10 and 11 use Mersenne Twister, in a state where two generated random number sequences are shifted by one clock, but are the same random number sequences, it cannot be said that the two generated random number sequences are uncorrelated for a practical use. For example, in a state where generated two random number sequences are shifted by $(2^{19337})/2$ clocks, it can be said that the two generated random number sequences are uncorrelated for a practical use.

In the sense above, the random number generator 10 and the random number generator 11 are random number generators independent of each other, and the random number sequence RND_A and the random number sequence RND_B that the random number generators 10 and 11 generate respectively, are not correlated with each other. In the random number sequence RND_A, there is no correlation between n bits when compared at the same clock cycle, or between the same bits when compared at different clock cycles, or between different bits when compared at different clock cycles. The random number sequence RND_B is similar to the random number sequence RND_A. In addition, between the random number sequence RND_A and the random number sequence RND_B, there is no correlation between any bits when compared in the same clock cycle, and no correlation between any bits when compared between different clock cycles.

The random number generators 10 and 11 may be pseudo random number generating circuits such as Mersenne Twister and an xorshift+. Although random number generator performance is inferior to Mersenne Twister, using a linear feedback shift register for the pseudo random number generating circuits, for example, is not excluded.

In a random number generating circuit illustrated in FIG. 1, the random number distributer 12 can be implemented by a delay adjustment such as a flip-flop and an exclusive-or operation as described later. When two random number generating circuits are provided, the desired number of random number sequences from RND_0 to RND_(N−1) that are not correlated with each other can be generated. Thus, when a random number generating circuit is implemented by an electronic circuit, the desired number of random number sequences can be generated with a simple structure and a small area of a circuit. In addition, when a random number generating circuit is implemented by software, the desired number of random number sequences can be generated with a simple structure and a small size of a program.

Figure 2:
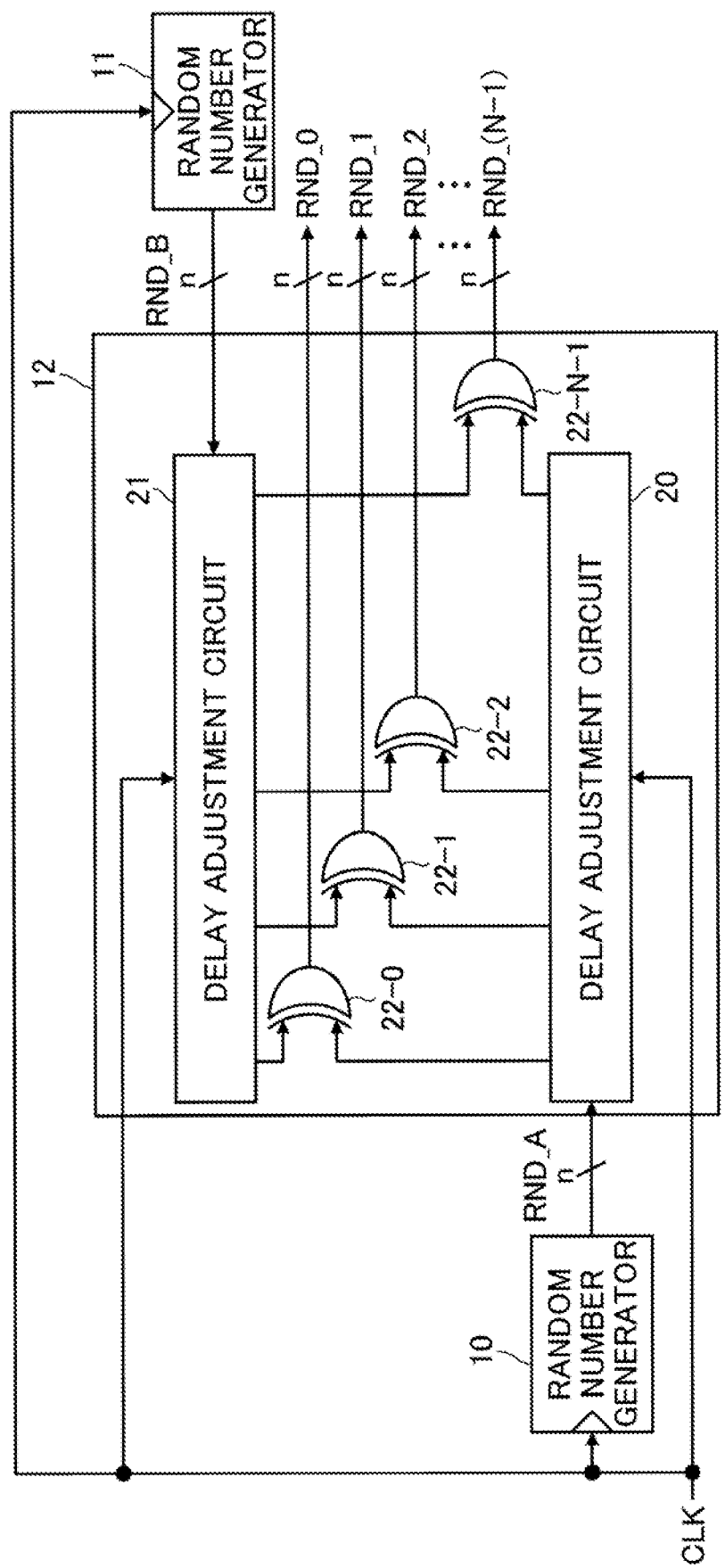
FIG. 2 is a drawing illustrating an example of a general configuration of a random number distributer of a random number generating circuit.

FIG. 2 is a drawing illustrating an example of a general configuration of the random number distributer 12 of a random number generating circuit. In the random number generating circuit illustrated in FIG. 2, the random number distributer 12 includes a delay adjustment circuit 20, a delay adjustment circuit 21, and N XOR (i.e., exclusive-or) gates from 22-0 to 22-N−1. The delay adjustment circuits 20 and 21 adjust a relative time difference between two random number sequences RND_A and RND_B by adjusting a delay of each random number sequence of the random number sequences RND_A and RND_B with synchronizing the clock signal CLK. The delay adjustment circuits 20 and 21 generate N sets (N is greater than or equal to 2) of two random number sequences having N different relative time differences by adjusting a relative time difference between two random number sequences RND_A and RND_B.

For convenience of description, each random number sequence is a 1 bit random number value. A value of the random number sequence RND_A at time t (i.e., a clock cycle t) is a(t), and a value of the random number sequence RND_B at time t (i.e., a clock cycle t) is b(t). The delay adjustment circuits 20 and 21 may output a(t) and b(t−k) as inputs to the XOR gate 22-k (where k=0, 1, 2, . . . , N−1), for example. In this case, a relative time difference between a(t) and b(t) that are inputs to the XOR gate 22-0 is 0, and a relative time difference between a(t) and b(t−1) that are inputs to the XOR gate 22-1 is 1 clock cycle. Similarly, for a given k that is from 0 to N−1, a relative time difference between a(t) and b(t−k) that are inputs to the XOR gate 22-k is k clock cycles. As this example, the delay adjustment circuits 20 and 21 output N sets of two random number sequences that have N different relative time differences (i.e., 0, 1, 2, 3, . . . , N−1 clock cycles difference in this example). An embodiment to achieve N different relative time differences is not limited to this example.

For N sets of two random number sequences, each of the N XOR gates from 22-0 to 22-N−1 that function as logical operation circuits performs an exclusive OR operation between two random number sequences included in a corresponding set. Outputs from the N exclusive OR operations are N random number sequences from RND_0 to RND_(N−1) where each random value is n bits. For convenience of illustration, each of the N XOR gates from 22-0 to 22-N−1 is illustrated as one XOR gate, but actually, n 2-input XOR gates processing 1 bit are provided in parallel. For example, when each random number sequence is a sequence of 1 bit random numbers, each of the XOR gates from 22-0 to 22-N−1 is one 2-input XOR gate processing 1 bit. For example, when each random number sequence is a sequence of 10 bit random numbers, each of the XOR gates from 22-0 to 22-N−1 is ten 2-input XOR gates processing 1 bit that are provided in parallel.

In configurations illustrated in FIG. 2 and the subsequent drawings, an exclusive OR instruction by an XOR gate is used as a logical operation circuit, but an XNOR (i.e., inverted value of exclusive OR) may be used instead of an XOR as an operation for generating the N random number sequences from RND_0 to RND_(N−1). Even when an XNOR is used as an operation of the logical operation circuit, the operation is equivalent to calculating an inverted value of a result of an exclusive OR operation, and it can be interpreted that an exclusive OR operation is performed in the logical operation circuit. Thus, a configuration that uses an XNOR as an operation performed by the logical operation circuit is included within the intended scope of the application.

For any given 2 bits taken from the N random number sequences from RND_0 to RND_(N−1) generated as above, the given 2 bits are not correlated between bits when compared at the same clock cycle, and are not correlated when compared between different clock cycles. This will be briefly described below.

For convenience of description, each random number sequence is a sequence of 1 bit random numbers as described above, and inputs to the XOR gate 22-k (where K=0, 1, 2, . . . , N−1) are a(t) and b(t−k). In this case, 1 bit value of a random number sequence RND_1 is an XOR value of a(t) and b(t−i), and 1 bit value of a random number sequence RND_j (where j≠i) is an XOR value of a(t) and b(t−j), for example. As j is not equal to i at this time, from an assumption of no correlation between b(t−i) and b(t−j), it is intuitively found that a correlation between two XOR values above at the same clock cycle is zero.

Furthermore, in order to consider a cross-correlation of the two XOR values between different clock cycles, shifting one of the two XOR values on a time axis is considered. When an XOR value of a(t) and b(t−i) is shifted to a cycle where i=j on a time axis for example, the value is an XOR value of a(t+i−j) and b(t−j). From an assumption that there is no correlation between a(t+i−j) and a(t), it is found that a correlation between the XOR value of a(t+i−j) and b(t−j) and the XOR value of a(t) and b(t−j) is zero. When shifting on a time axis is different from the above, it is clear that a correlation between two XOR values is not caused.

As described above, M random number generators that are independent of each other and generate M random number sequences, may be generally provided. The delay adjustment circuit may output N sets of M random number sequences having N different relative time differences by adjusting a relative time difference between M random number sequences. Furthermore, for N sets of M random number sequences, each of the logical operation circuits (e.g., a group of XOR gates) may perform an exclusive OR operation between M random number sequences included in a corresponding set. However, as described above, only two random number generating circuits can generate the desired number of random number sequences that are not correlated with each other at the same clock cycle, and even between different clock cycles. Thus, a configuration in which two random number generating circuits are provided can generate the desired number of random number sequences that are not correlated with each other by using a small area of a circuit and a small calculation amount.

In consideration of using at least two random number generating circuits, the number N of output random number sequences is preferably 3 or more in a sense that more random number sequences than random generating circuits are generated. But, even when the number N of output random number sequences is equal to 2, the configuration described in FIG. 1 or FIG. 2 can be applied. In addition to the output random number sequences from RND_0 to RND_(N−1), the random number sequence RND_A of the random number generator 10 and the random number sequence RND_B of the random number generator 11 may be used as output random number sequences from random number generators.

Figure 3:
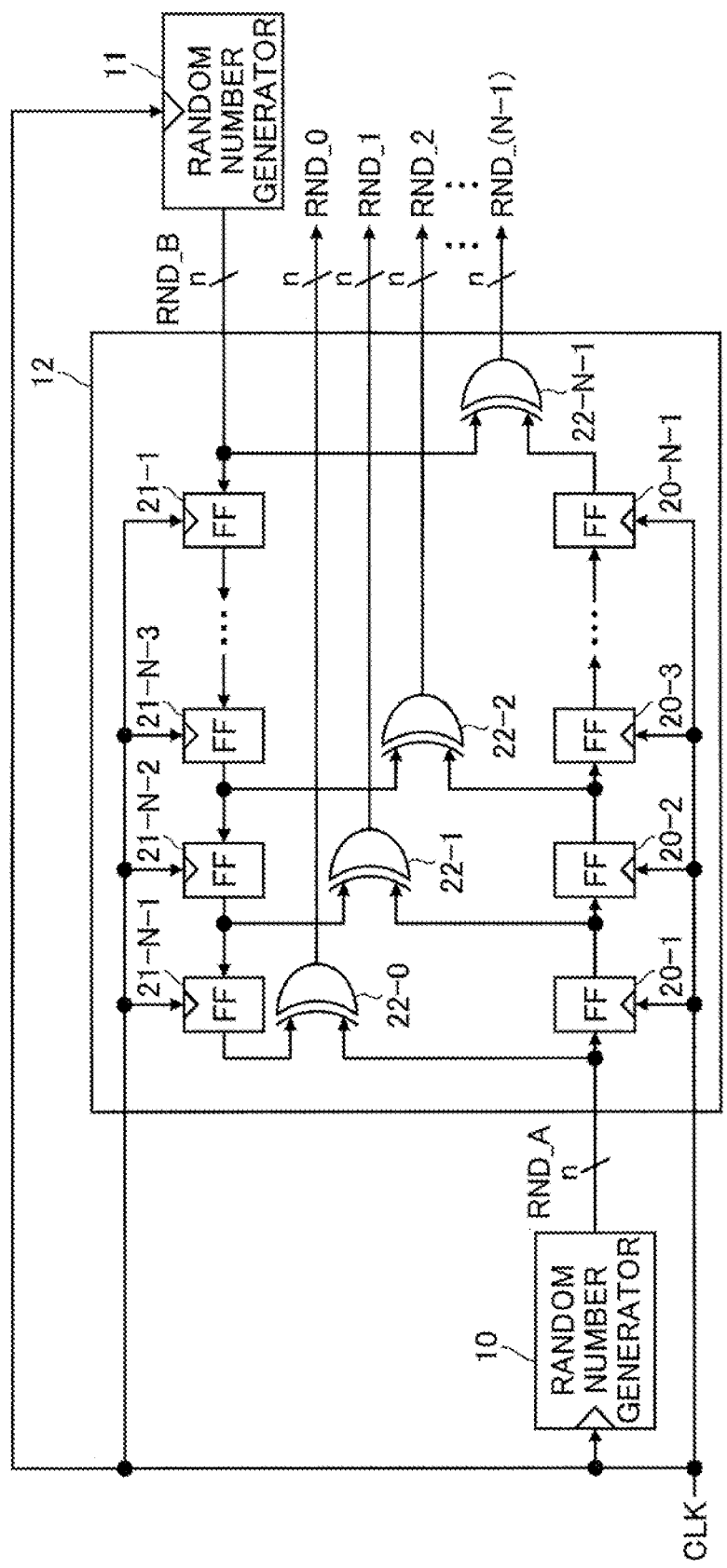
FIG. 3 is a drawing illustrating an example of a configuration of a random number distributer of a first embodiment.

FIG. 3 is a drawing illustrating an example of a configuration of the random number distributer 12 of a first embodiment. The random number generating circuit illustrated in FIG. 3 indicates a specific configuration of the delay adjustment circuit 20 and the delay adjustment circuit 21 of the random number distributer 12 in the random number generating circuit illustrated in FIG. 2.

In the random number generating circuit illustrated in FIG. 3, the random number distributer 12 includes N−1 flip-flops from 20-1 to 20-N−1, N−1 flip-flops from 21-1 to 21-N−1, and N XOR gates from 22-0 to 22-N−1. The N−1 flip-flops from 20-1 to 20-N−1 are corresponding to the delay adjustment circuit 20 in FIG. 2, and function as a first shift register to which a random number sequence output from the random number generator 10 is input. The N−1 flip-flops from 21-1 to 21-N−1 are corresponding to the delay adjustment circuit 21 in FIG. 2, and function as a second shift register to which a random number sequence output from the random number generator 11 is input. The clock signal CLK is applied to a clock input terminal of each flip-flop.

The first and second shift registers adjust a relative time difference between two random number sequences RND_A and RND_B by adjusting each delay of two random number sequences RND_A and RND_B. By adjusting a relative time difference between two random number sequences RND_A and RND_B as described, N sets of two random number sequences having N different relative time differences (where N is an integer greater than or equal to 2), can be obtained.

More specifically, delays of the N−1 flip-flops from 20-1 to 20-N−1 included in the first shift register generate N first random number sequences that have different delay amounts from each other. Delays of the N−1 flip-flops from 21-1 to 21-N−1 included in the second shift register generate N second random number sequences that have different delay amounts from each other. A combination of the first random number sequence and the second random number sequence achieves N different relative time differences.

In order to achieve N different relative time differences described above, the random number distributer 12 illustrated in FIG. 3 sets a signal propagation direction of each shift register such that for an input to the XOR gate 22-$k$ (where k=0, 1, 2, ..., N−1), as k increases, a delay of the random number sequence RND_B decreases while a delay of the random number sequence RND_A increases. For convenience of description, each random number sequence is a sequence of 1 bit random numbers as described above. Random number sequences input to the XOR gate 22-$k$ are a(t−k) that is a value of the random number sequence RND_A with a k clock cycles delay and b(t+k−N+1) that is a value of the random number sequence RND_B with an N−1−k clock cycles delay. Thus, the random number sequence RND_k that is output from the XOR gate 22-$k$ is the following.

$$a(t-k)\char`\^b(t+k-N+1)$$

Here, an operator "^" indicates an XOR. Similarly, the random number sequence RND_m that is output from the XOR gate 22-$m$ (where m=0, 1, 2, ..., N−1) is the following.

$$a(t-m)\char`\^b(t+m-N+1)$$

Thus, a cross-correlation R(j) between the random number sequence RND_k and the random number sequence RND_m that shift j clock cycles from each other is expressed in the following by using an expected value E[•].

$$R(j) = E[\text{RND\_k}(t) \cdot \text{RND\_m}(t+j)] \quad (1)$$
$$= E[a(t-k) \wedge b(t+k-N+1) \cdot a(t-m+j) \wedge b(t+m-N+1+j)]$$

To simplify a calculation, a value of each bit is expressed in [−1, 1] instead of [0,1]. In this case, a relation between a multiplication and an XOR operation is x·y=−x^y. Thus, a value of the expression (1) is as follows.

$$R(j) = -E[a(t-k)\char`\^b(t+k-N+1)\char`\^a(t-m+j)\char`\^b(t+m-N+1+j)] \quad (2)$$

Here when j=m−k, the expression (2) is further as follows.

$$R(j) = -E[a(t-k) \wedge b(t+k-N+1) \wedge a(t-k) \wedge b(t+2m-N+1-k)]$$
$$= E[b(t+k-N+1) \wedge b(t+2m-N+1-k)]$$
$$= 0$$

This is because an XOR of two of the same value a(t−k) is −1. Furthermore, this is because b(t+k−N+1) and b(t+2m−N+1−k) are values of the random number sequence b(t) at different clock cycles, and a correlation of each other is zero.

Similarly, when j=k−m, a value of the expression (2) is as follows.

$$R(j) = -E[a(t-k) \wedge b(t+k-N+1) \wedge a(t-2m+k) \wedge b(t+k-N+1)]$$
$$= E[b(t+k-N+1) \wedge b(t+2m-N+1-k)]$$
$$= 0$$

This is because an XOR of two of the same value b(t+k−N+1) is −1. Furthermore, this is because a(t−k) and b(t−2m+k) are values of the random number sequence a(t) at different clock cycles, and a correlation of each other is zero.

When a value of j is other than the above, elements in E[•] of the expression (2) are clearly not correlated with each other, and a value of the expression (2) is zero. Consequently, regardless of the value of j, a value of the cross-correlation R(j) is always zero. Thus, it is found that any two random number sequences RND_k and RND_m selected from the random number sequences RND_0 to RND_(N−1) are not correlated.

As described above, in the random number generating circuit illustrated in FIG. 3, the random number distributer 12 can be implemented by a simple configuration that includes two shift registers and multiple XOR gates. Thus, the desired number of random number sequences can be generated by a simple circuit configuration and a small circuit area.

Figure 4:
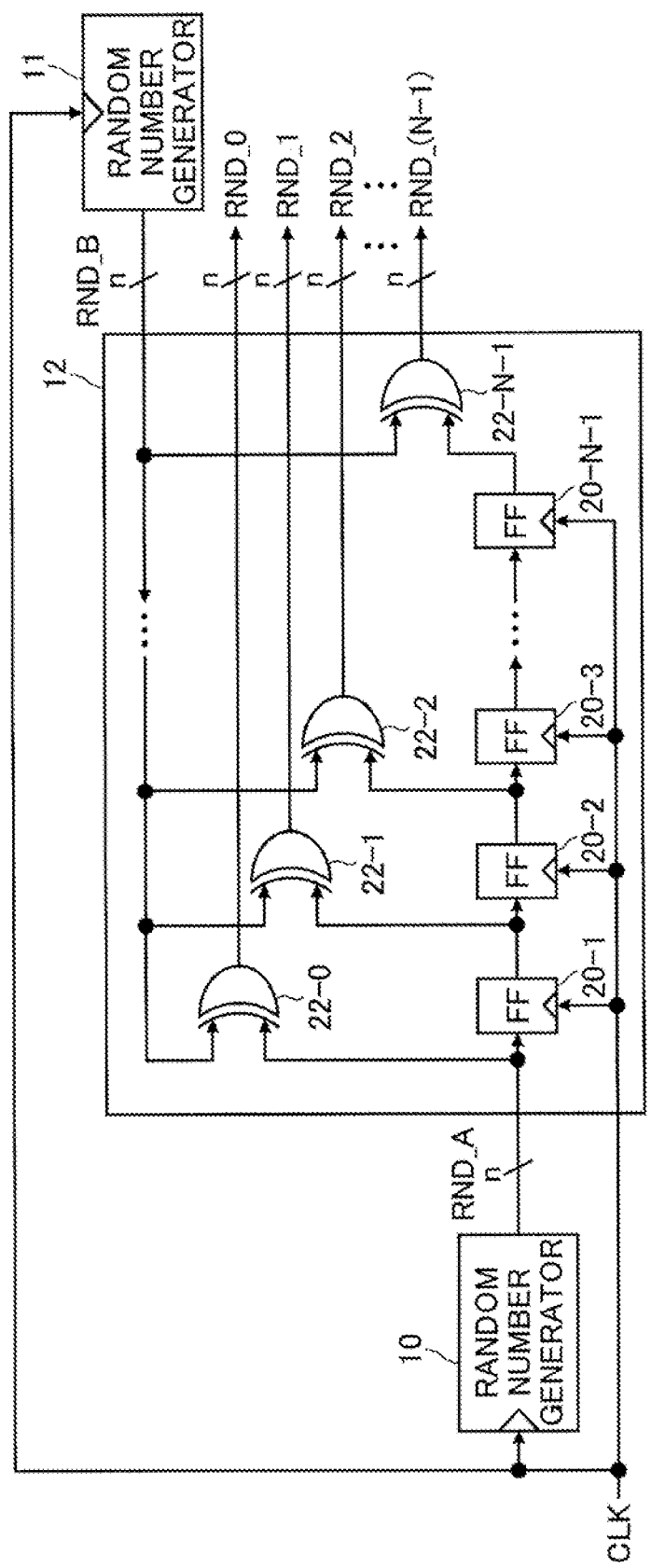
FIG. 4 is a drawing illustrating an example of a configuration of a random number distributer of a second embodiment.

FIG. 4 is a drawing illustrating an example of a configuration of the random number distributer 12 of a second embodiment. The random number generating circuit illustrated in FIG. 4 indicates a specific configuration of the delay adjustment circuit 20 and the delay adjustment circuit 21 of the random number distributer 12 in the random number generating circuit illustrated in FIG. 2.

In the random number generating circuit illustrated in FIG. 4, the random number distributer 12 includes N−1 flip-flops from 20-1 to 20-N−1 and N XOR gates from 22-0 to 22-N−1. The N−1 flip-flops from 20-1 to 20-N−1 are corresponding to the delay adjustment circuit 20 in FIG. 2, and function as a shift register to which a random number sequence output from the random number generator 10 is input. In the configuration of the random number generating circuit illustrated in FIG. 4, the delay adjustment circuit 21 in FIG. 2 is a signal wiring that provides the random number sequence RND_B that the random number generator 11 generates, without any clock cycle delay.

The shift register adjusts a relative time difference between two random number sequences RND_A and RND_B by adjusting a delay of the random number sequence RND_A. By adjusting a relative time difference between two random number sequences RND_A and RND_B as described, N sets of two random number sequences having N different relative time differences (where N is an integer greater than or equal to 2), can be obtained.

More specifically, with respect to the random number sequence RND_A that the random number generator 10 generates, delays of N−1 flip-flops from 20-1 to 20-N−1 included in the shift register generate N random number sequences having different delay amounts from each other. A combination of the N random number sequences and one random number sequence RND_B that the random number generator 11 generates with no delay, achieves N different relative time differences.

As described in relation to the configuration of the random number generating circuit illustrated in FIG. 2 and FIG. 3, for N sets of two random number sequences having N different relative time differences, N random number sequences generated by performing an XOR operation of the two random number sequences in each set are not correlated with each other. In the random number generating circuit illustrated in FIG. 4, the N random number sequences from RND_0 to RND_(N−1) obtained by the N XOR gates from 22-0 to 22-N−1 are random number sequences that are not correlated with each other at the same clock cycle and between different clock cycles.

As described above, in the random number generating circuit illustrated in FIG. 4, a simple configuration including one shift register and multiple XOR gates can implement the random number distributer 12. Thus, the desired number of random number sequences can be generated by a simple circuit configuration and a small circuit area.

Figure 5:
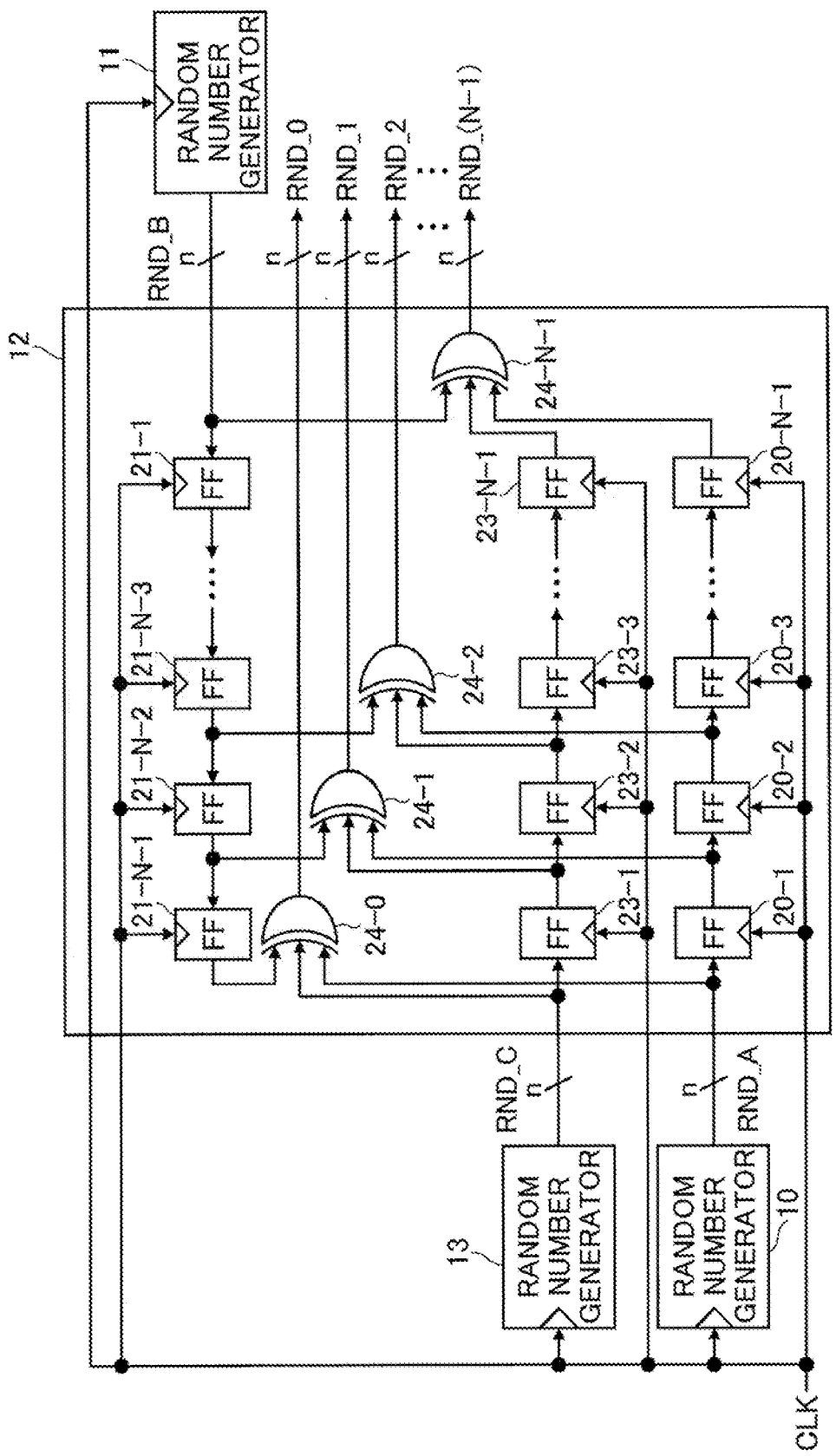
FIG. 5 is a drawing illustrating an example of a configuration of a random number distributer of a third embodiment.

FIG. 5 is a drawing illustrating an example of a configuration of the random number distributer 12 of a third embodiment. The random number generating circuit illustrated in FIG. 5 generates N random number sequences from RND_0 to RND_(N−1) based on three random number sequences generated by three random number generators.

The random number generating circuit illustrated in FIG. 5 includes the random number generator 10, the random number generator 11, the random number generator 13, and the random number distributer 12. The random number generator 10, the random number generator 11, and the random number generator 13 are random number generators independent of each other, and a random number sequence RND_A, a random number sequence RND_B, and a random number sequence RND_C that the random number generators 10, 11, and 13 generate respectively are not correlated with each other. For each random number sequence, there is no correlation between n bits when compared at the same clock cycle, or between the same bits when compared between different clock cycles, or between different bits when compared between different clock cycles. In addition, between any two random number sequences, there is no correlation between any bits when compared at the same clock cycle, and no correlation between any bits when compared between different clock cycles.

The random number distributer 12 includes N−1 flip-flops from 20-1 to 20-N−1, N−1 flip-flops from 21-1 to 21-N−1, and N−1 flip-flops from 23-1 to 23-N−1. The random number distributer 12 further includes N XOR gates from 24-0 to 24-N−1.

The N−1 flip-flops from 20-1 to 20-N−1 function as a first shift register to which the random number sequence RND_A output from the random number generator 10 is input. The N−1 flip-flops from 21-1 to 21-N−1 function as a second shift register to which the random number sequence RND_B output from the random number generator 11 is input. The N−1 flip-flops from 23-1 to 23-N−1 function as a third shift register to which the random number sequence RND_C output from the random number generator 13 is input. The first to third shift registers output N sets of three random number sequences having N different relative time differences by adjusting a relative time difference between three random number sequences RND_A, RND_B, and RND_C.

Specifically, delays by N−1 flip-flops from 20-1 to 20-N−1 included in the first shift register generate N first random number sequences having delay amounts different from each other. Furthermore, delays by N−1 flip-flops from 21-1 to 21-N−1 included in the second shift register generate N second random number sequences having delay amounts different from each other. Still furthermore, delays by N−1 flip-flops from 23-1 to 23-N−1 included in the third shift register generate N third random number sequences having delay amounts different from each other. A combination of the first to third random number sequences achieves N different relative time differences.

For N sets of three random number sequences, the N XOR gates from 24-0 to 24-N−1 that function as the logical operation circuit perform an exclusive OR operation between three random number sequences included in each set. Outputs of N exclusive OR operations are N random number sequences from RND_0 to RND_(N−1) in which each random number is n bits. For convenience of illustration, each of the N XOR gates from 24-0 to 24-N−1 is illustrated as one XOR gate, but actually, n 3-input XOR gates processing 1 bit are provided in parallel. For example, when each random number sequence is a sequence of 1 bit random numbers, each of the XOR gates from 24-0 to 24-N−1 is one 3-input XOR gate processing 1 bit. For example, when each random number sequence is a sequence of 10 bit random numbers, each of the XOR gates from 24-0 to 24-N−1 is ten 3-input XOR gates processing 1 bit that are provided in parallel.

In the configuration illustrated in FIG. 5, a signal propagation direction of each shift register is set, such that for an input to the XOR gate 22-$k$ (where k=0, 1, 2, . . . , N−1), as k increases, a delay of the random number sequence RND_B decreases while delays of the random number sequences RND_A and RND_C increase. For convenience of description, each random number sequence is a sequence of 1 bit random numbers as described above. Random number sequences input to the XOR gate 22-$k$ are a(t−k) that is a value of the random number sequence RND_A with a k clock cycles delay, c(t−k) that is a value of the random number sequence RND_C with a k clock cycles delay, and b(t+k−N+1) that is a value of the random number sequence RND_B with an N−1−k clock cycles delay.

In this case, considering, with reference to the random number sequence RND_B, a pair of a time difference TA of the random number sequence RND_A and a time difference TC of a random number sequence RND_C, a pair of relative time differences of random number sequences input to the XOR gate 22-$k$ is (TA, TC)=(N−1−2k, N−1−2k). This relative time difference is different for each of the N XOR gates from 24-0 to 24-N−1. Thus, the N random number sequences from RND_0 to RND_(N−1) obtained by the N XOR gates from 22-0 to 22-N−1 are not correlated with each other at the same clock cycle and between different clock cycles.

In the configuration illustrated in FIG. 5, a relative time difference between the random number sequence RND_A and the random number sequence RND_C is set to zero. Alternatively, for example, with respect to the random number sequence RND_C, similar to a control of the random number sequence RND_B in FIG. 4, the random number sequence RND_C may be input to XOR gates without any delay. In this case, a pair of relative time differences of the random number sequence described above is (TA, TC)=(N−1−2k, N−1−k).

Figure 6:
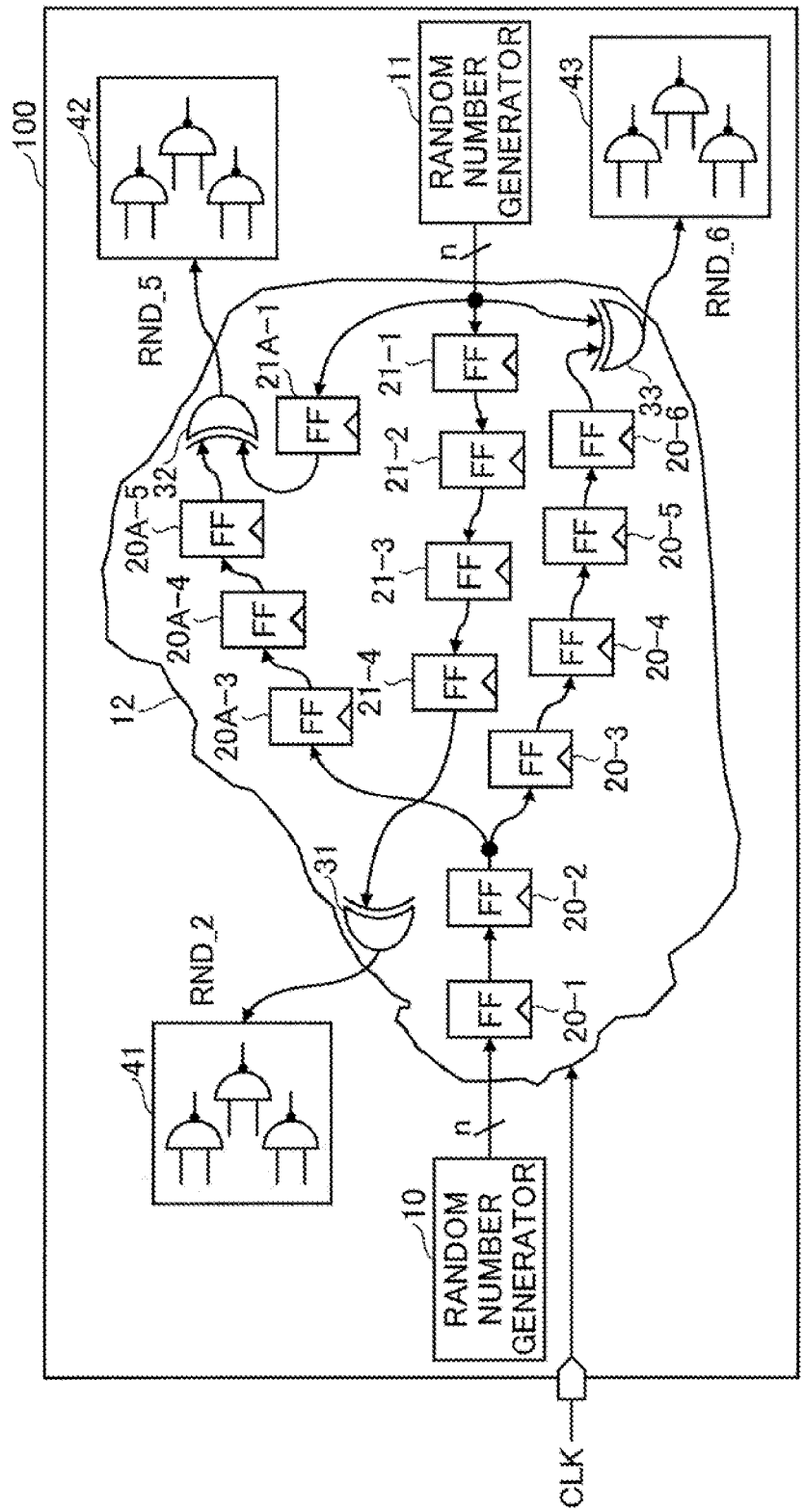
FIG. 6 is a drawing illustrating an example of a configuration of a semiconductor apparatus equipped with a random number generating circuit.

FIG. 6 is a drawing illustrating an example of a configuration of a semiconductor apparatus equipped with a random number generating circuit. A semiconductor apparatus 100 illustrated in FIG. 6 includes the random number generator 10, the random number generator 11, the random number distributer 12, and operation circuits from 41 to 43. The random number generator 10, the random number generator 11, and the random number distributer 12 may generate the N random number sequences from RND_0 to RND_(N−1) as described with reference to FIG. 1 to FIG. 5. For convenience of illustration, the random number sequences RND_2, RND_5, and RND_6 are illustrated in FIG. 6.

The random number distributer 12 includes flip-flops from 20-1 to 20-6 and from 20A-3 to 20A-5, flip-flops from 21-1 to 21-4 and 21A-1, and XOR gates from 31 to 33. The flip-flops from 20-1 to 20-6 are corresponding to all or a part of the flip-flops from 20-1 to 20-N−1 in FIG. 3, and delay the random number sequence that the random number generator 10 generates with synchronizing the clock signal CLK. The flip-flops from 21-1 to 21-4 are corresponding to all or a part of the flip-flops from 21-1 to 21-N−1 in FIG. 3, and delay the random number sequence that the random number generator 11 generates with synchronizing the clock signal CLK. For convenience of illustration, an application of a clock signal to each flip-flop is omitted in illustration.

The flip-flops from 20A-3 to 20A-5 are arranged along another signal propagation path that is branched from a signal propagation path where the flip-flops from 20-1 to 20-6 are arranged. Logically, output values of the flip-flops from 20A-3 to 20A-5 are equal to output values of the flip-flops from 20-3 to 20-5, respectively. Similarly, the flip-flop 21A-1 is arranged along another signal propagation path that is branched from a signal propagation path where the flip-flops from 21-1 to 21-4 are arranged. Logically, an output value of the flip-flop 21A-1 is equal to an output value of the flip-flop 21-1.

The operation circuits 41, 42 and 43 receive inputs of results of exclusive OR operations that the XOr gates 31, 32, and 33 perform respectively. The XOR gates 31, 32, and 33 are arranged near (i.e., at positions physically close to) the corresponding operation circuits 41, 42, and 43 respectively. The XOR gates from 31 to 33 are corresponding to a part of the XOR gates from 22-0 to 22-N−1 in FIG. 3. The operation circuits 41, 42, and 43 perform operations that use the respective random number sequences RND_2, RND_5, and RND_6. An operation may be a Monte Carlo simulation or stochastic computing.

In the configuration illustrated in FIG. 6, flip-flops included in shift registers are arranged along the signal propagation path from physical positions of the two random number generators 10 and 11 to physical positions of the operation circuits from 41 to 43. Here, the description that flip-flops are arranged along the signal propagation path indicates that multiple flip-flops are arranged at approximately equal intervals between a start point and an end point of the signal.

Specifically, the flip-flops from 20-1 and 20-2 are arranged along the signal propagation path from a physical position of the random number generator 10 to a physical position of the operation circuit 41. The flip-flops 20-1, 20-2, and from 20A-3 to 20A-5 are arranged along the signal propagation path from a physical position of the random number generator 10 to a physical position of the operation circuit 42. The flip-flops from 20-1 to 20-6 are arranged along the signal propagation path from a physical position of the random number generator 10 to a physical position of the operation circuit 43.

Similarly, the flip-flops from 21-1 to 21-4 are arranged along the signal propagation path from a physical position of the random number generator 11 to a physical position of the operation circuit 41. The flip-flop 21A-1 is arranged along the signal propagation path from a physical position of the random number generator 11 to a physical position of the operation circuit 42. As a physical position of the random number generator 11 is near a physical position of the operation circuit 43, a flip-flop is not arranged along the signal propagation path to the operation circuit 43.

As described above, by arranging flip-flops along the signal propagation path, a function to delay a random number sequence as a delay adjustment circuit can be achieved. At the same time, an effect of avoiding a malfunction caused by waveform deterioration associated with a signal line extension can be obtained. Additionally, by branching the signal propagation path where flip-flops are arranged, a signal in an appropriate delay status (i.e., a signal of a desired relative time difference) can be provided to an XOR circuit corresponding to each operation circuit without causing waveform deterioration by an excessive extension of a signal line.

Figure 7:
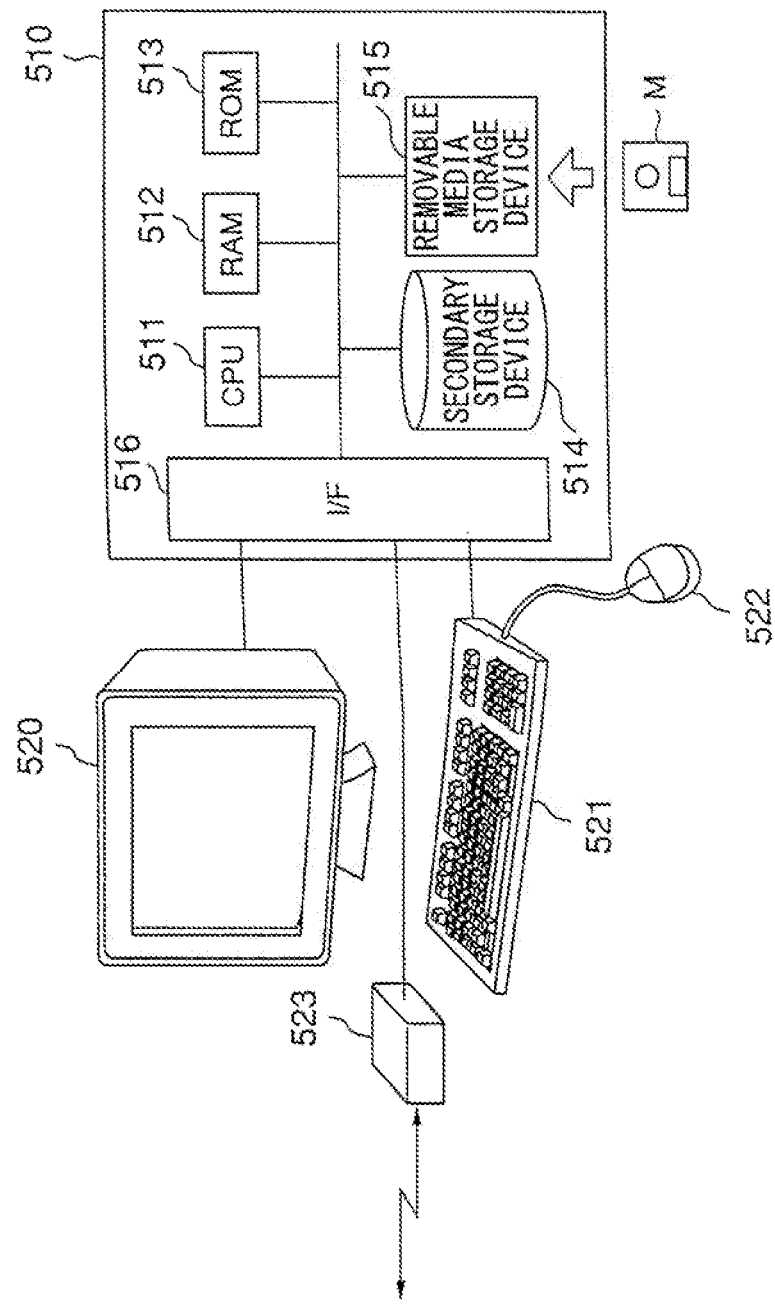
FIG. 7 is a drawing illustrating a configuration of an apparatus implementing a random number generating circuit in software.

FIG. 7 is a drawing illustrating a configuration of an apparatus implementing a random number generating circuit in software. As described above, a random number generating process performed by the random number generating circuit described above may be implemented in software.

As illustrated in FIG. 7, an apparatus implementing the random number generating circuit may be achieved by a computer such as a personal computer. The apparatus in FIG. 7 includes a computer 510, a display device 520 connected to the computer 510, a communication device 523 and an input device. The input device includes a keyboard 521 and a mouse 522 for example. The computer 510 includes a CPU 511, a RAM 512, a ROM 513, a secondary storage device 514 such as a hard disk, a removable media storage device 515, and an interface 516.

The keyboard 521 and the mouse 522 provide an interface for a user, and various commands for operating the computer 510 and a user response to requested data are input, for example. The display device 520 displays a result processed by the computer 510 or the like, and various data in order to enable a user to interact when a user operates the computer 510. The communication device 523 is a device for communicating with a peripheral device or performing communication to a remote location, and is a modem, a network interface, and USB (Universal Serial Bus), for example.

A function of the random number generating circuit is provided as a computer program that the computer 510 can execute. The computer program is stored in a storage medium M that can attach to the removable media storage device 515, and is loaded into the RAM 512 or the secondary storage device 514 from the storage medium M through the removable media storage device 515. Alternatively, the computer program is stored in a peripheral device or a storage medium in a remote location (which is not illustrated), is loaded into the RAM 512 or the secondary storage device 514 from the storage medium through the communication device 523 and the interface 516.

In response to a program execution instruction form a user through the keyboard 521 and/or the mouse 522, the CPU 511 loads the program into the RAM 512 from the storage medium M, the peripheral device, the storage medium in a remote location, or the secondary storage device 514. The CPU 511 uses unoccupied storage space of the RAM 512 as a work area, and executes the program loaded into the RAM 512, and proceeds by interacting with a user appropriately. The ROM 513 stores a control program for controlling a basic operation of the computer 510.

By executing the computer program described above, the computer 510 performs a random number generating process of the random number generating circuit as described in each embodiment above.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A random number generating circuit comprising:
   two random number generators configured to be independent of each other and generate two random number sequences;
   a delay adjustment circuit configured to output N sets of the two random number sequences including N different relative time differences, where N is an integer greater than or equal to 2, by adjusting relative time differences between the two random number sequences; and
   a logic operation circuit configured to perform an exclusive OR operation between the two random number sequences included in a set, for each of the N sets of the two random number sequences,
   the two random number generators include a first random number generator and a second random number generator, and
   the delay adjustment circuit includes one shift register to which a random number sequence that the first random number generator outputs is input, and signal wiring to which a random number sequence that the second random number generator outputs is input,
   the N different relative time differences are achieved by combinations between N random number sequences including respective delay amounts different from each other that are generated by delays of N−1 flip-flops included in the one shift register, and N random number sequences, including no delay amount, that are provided by the signal wiring, and
   each set of the N sets of the two random number sequences includes a corresponding one of the N random number sequences including the respective delay amounts and a corresponding one of the N random number sequences including no delay amount.

2. The random number generating circuit as claimed in claim 1, wherein the flip-flops included in the one shift register are arranged along a signal propagation path from a physical position of the first random number generator to a physical position of a circuit to which a result of an exclusive OR operation that the logic operation circuit performs is input.

3. A semiconductor apparatus, comprising:
   two random number generators configured to be independent of each other and generate two random number sequences;
   a delay adjustment circuit configured to output N sets of the two random number sequences including N different relative time differences, where N is an integer greater than or equal to 2, by adjusting relative time differences between the two random number sequences;
   a logic operation circuit configured to perform an exclusive OR operation between the two random number sequences included in a set, for each of the N sets of the two random number sequences; and
   a circuit to which a result of the exclusive OR operation that the logic operation circuit performs is input,
   the two random number generators include a first random number generator and a second random number generator, and
   the delay adjustment circuit includes one shift register to which a random number sequence that the first random number generator outputs is input, and signal wiring to which a random number sequence that the second random number generator outputs is input,
   the N different relative time differences are achieved by combinations between N random number sequences including respective delay amounts different from each other that are generated by delays of N−1 flip-flops included in the one shift register, and N random number sequences, including no delay amount, that are provided by the signal wiring, and
   each set of the N sets of the two random number sequences includes a corresponding one of the N random number sequences including the respective delay amounts and a corresponding one of the N random number sequences including no delay amount.

4. The semiconductor apparatus as claimed in claim 3, wherein flip-flops included in the one shift register are arranged along a signal propagation path from a physical position of a corresponding random number generator of the two random number generators to a physical position of the circuit.

5. The semiconductor apparatus as claimed in claim 4, wherein the signal propagation path where the flip-flops are arranged includes a branch.

6. A non-transitory computer-readable recording medium having stored therein a program for causing a computer to execute a method of generating random number sequences uncorrelated in time used for an operation stochastically performed by a computer, the method comprising:
   generating two random number sequences from two random number generators that are configured to be independent of each other;
   outputting, from a delay adjustment circuit, N sets of the two random number sequences including N different relative time differences, where N is an integer greater than or equal to 2, by adjusting one or more relative time differences between the two random number sequences; and
   performing, by a logic operation circuit, an exclusive OR operation between the two random number sequences included in a set, for each of the N sets of the two random number sequences,
   the two random number sequences include a first random number sequence and a second random number sequence, and the N different relative time differences are achieved by combinations of N random number sequences, including respective delay amounts different from each other, that are generated from the first random number sequence, and N random number sequences, including no delay amount, that are provided from the second random number sequence, and each set of the N sets of the two random number sequences includes a corresponding one of the N random number sequences including the respective delay amounts and a corresponding one of the N random number sequences including no delay amount.

* * * * *